United States Patent [19]

Bridenbaugh et al.

[11] 4,002,725
[45] Jan. 11, 1977

[54] PROCESS FOR GROWING ACICULA OF RARE EARTH PENTAPHOSPHATES

[75] Inventors: Paul Michael Bridenbaugh, Whitehouse Station; Paul Foo-Hung Liao, Middletown, both of N.J.; Bruce Cedric Tofield, Abingdon, England; Heinz Paul Weber, Middletown, N.J.

[73] Assignee: Bell Telephone Laboratories, Incorporated, Murray Hill, N.J.

[22] Filed: July 9, 1975

[21] Appl. No.: 594,193

[52] U.S. Cl. .............................. 423/263; 423/305; 331/94.5 F
[51] Int. Cl.² ....................................... C01F 17/00
[58] Field of Search ................... 423/263, 305, 314

[56] References Cited
UNITED STATES PATENTS 3,813,613    5/1974    Danielmeyer et al. ..... 423/263 UX

OTHER PUBLICATIONS

Miller et al., "Journal of Crystal Growth," vol. 23, 1974, pp. 313–317.
Danielmeyer et al., "Journal of Crystal Growth," vol. 22, 1974, pp. 298–302.
Tofield et al., "Materials Research Bull.," vol. 9, 1974, pp. 435–448.
Stone et al., "Applied Optics," vol. 13, 1974, pp. 1256–1261.
Weber et al., "Applied Physics Letters," vol. 26, 1975, pp. 692–694.

*Primary Examiner*—Herbert T. Carter
*Attorney, Agent, or Firm*—Wilford L. Wisner; Daniel D. Dubosky

[57] ABSTRACT

Acicula of rare earth pentaphosphates, of a diameter and length ideal for waveguiding laser-type applications, are grown by controlling the rate of metaphosphoric acid conversion by introducing water vapor into an inert gas atmosphere continuously flowed through the reaction zone. The required amount of water vapor in the reaction zone has to be within the range between approximately 14 grams per cubic meter and 290 grams per cubic meter of the flowing atmosphere. This control is implemented by bubbling the inert gas atmosphere through a water bath at temperatures between 15° and 80° C. It is believed that the control of the water vapor eliminates problems of supersaturation in the forming of pentaphosphoric crystals in the growth solution and thereby promotes their natural tendency to form purely chainlike polymer structures.

2 Claims, 6 Drawing Figures

PROCESS FOR GROWING ACICULA OF RARE EARTH PENTAPHOSPHATES

BACKGROUND OF THE INVENTION

This invention relates to methods for growing waveguiding-type single crystals of rare earth pentaphosphates, particularly those of a nature suitable for optical device use.

The discovery of rare earth pentaphosphates particularly suitable for laser use has been previously disclosed in U.S. Pat. No. 3,813,613 of H. G. Danielmeyer et al., issued May 28, 1974. This type of laser material was found to have potential advantages over prior art types of rare earth-containing compounds, such as neodymium-doped yttrium aluminum garnet. The approximately 30 times higher concentration of neodymium leads to a relative miniaturization of devices and to a potential for reduced threshold for a side-pumped version of the laser.

It has been recently discovered that the prior art neodymium-containing crystals, such as yttrium aluminum garnet can be grown in a single crystal fiber form in which the pump light and the laser light are waveguided. Such a configuration is particularly advantageous in view of its compatibility with proposed optical fiber communication systems.

Clearly it would be advantageous to have rare earth pentaphosphate crystals in a similar waveguiding form, and perhaps with even smaller diameters and shorter lengths because of the higher concentration of the active ions. In addition, the number of axial and transverse modes permitted by the laser device should be clearly reduced in such a miniaturized device, as compared with the larger devices.

SUMMARY OF THE INVENTION

We have discovered that single-crystal acicula, that is, crystals of needle-like shape can be formed by growth in solution. The rare earth pentaphosphate acicula are preferentially grown when the rate of conversion of phosphoric acids to more condensed poly-acid forms in the growth solution is controlled or moderated by introducing an appropriate proportion of water vapor in a stream of inert gas constantly flowed over the heated mixture of the rare earth compounds and phosphoric acids.

According to a first feature of our invention, the amount of water vapor in the inert gas stream over the mixture at the interaction temperature is in the range between about 14 grams per cubic meter and about 290 grams per cubic meter for preferential growth of acicula.

According to a second feature of our invention, in which the growth process is viewed in a slightly different aspect, the inert gas stream to be flowed over the mixture is bubbled through a water bath, the temperature of which is controlled to be in the range between about 15° and 80° C, whereby the preferential growth of acicula in the solution is promoted. The controlled conversion is continued so long as acicula continue to grow. Thereafter, the acicula are removed and prepared for operation in active optical devices.

BRIEF DESCRIPTION OF THE DRAWING

Further features and advantages of our invention will become apparent from the following detailed description, taken together with the drawing, in which.

DESCRIPTION OF ILLUSTRATIVE EMBODIMENT

Figure 1:
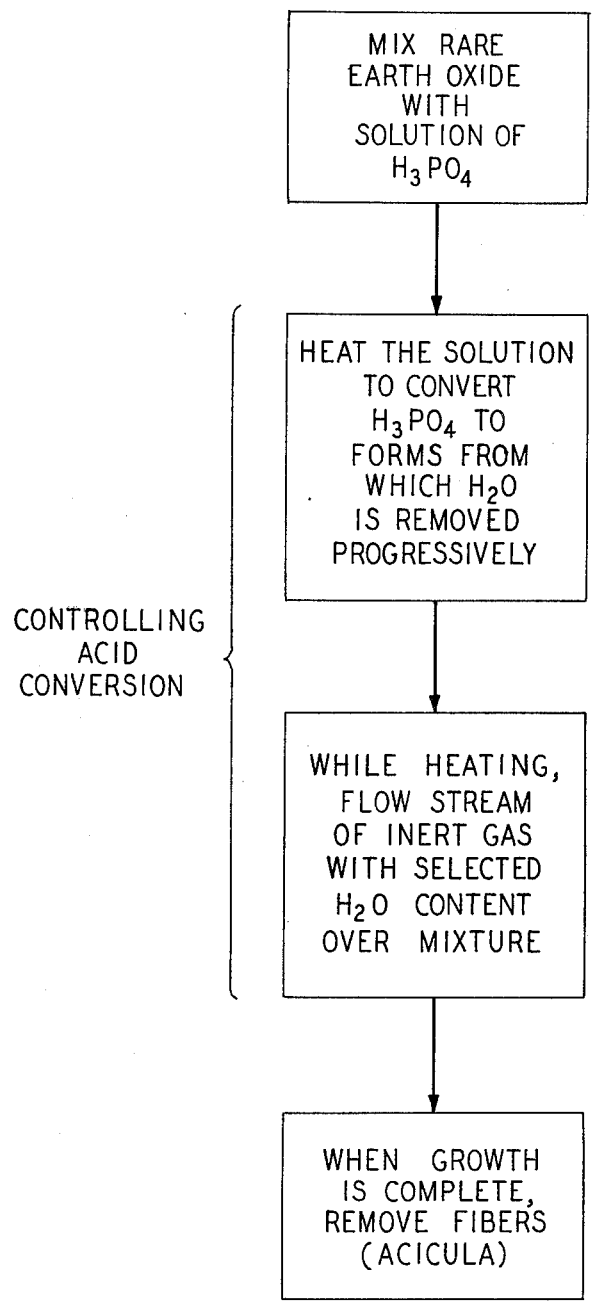
FIG. 1 is a block diagrammatic flow chart of the method of the invention.

In FIG. 1 we summarize the method of our invention. It includes processing steps as shown and generally in the sequence shown.

First, rare earth oxides such as neodymium oxide ($Nd_2O_3$), are mixed with phosphoric acid ($H_3PO_4$), typically an 85 percent phosphoric acid solution containing between 0.75 gram and 2.5 grams of the rare earth oxide per 100 milli-liters of the acid solution. This mixture is placed in a nonreactive crucible, such as a gold crucible or a vitreous graphite crucible.

The solution is then heated to convert the phosphoric acid to more condensed poly-acid forms through the sequence of acids including metaphosphoric acid, water vapor being progressively removed from the mixture as the conversion of acid forms continues. The details of the process thus far are more fully described in the above-cited U.S. Pat. No. 3,813,613.

Simultaneously with the heating, the acid conversion is controlled according to our invention. The acid conversion is controlled by flowing a selected amount of water vapor in an inert gas over the mixture. Continuous flow is preferred. It should be clear at the outset that these steps remain much the same regardless of the initial constituents of the mixture, which can vary over a range of initial rare earth oxide concentrations; but the temperatures and other conditions of the process from the time of initial heating onward must be more carefully controlled to lie in a much narrower range than those of the above-described patent in order to obtain acicula according to our present invention. Nevertheless, it is also preferred that the initial rare earth oxide concentration be kept between about 0.75 and 2.5 grams per 100 milli-liters of the phosphoric acid solution.

Our best results so far were obtained when the water vapor that moderates the growth process was introduced into the interaction zone by bubbling a stream of nitrogen gas through a water bath maintained substantially constant at about 25° C. Without the addition of water vapor to the gas stream, no acicula are obtained. We submit the tentative theory, without wishing to limit our invention thereto, that the water vapor effects the condensation of phosphoric acid to poly acids and that its presence helps speed the establishment of equilibrium and eliminates problems of supersaturation, so that the pentaphosphate crystals can follow their apparent tendency to form chainlike polymers. It seems logical to hypothesize that the non-waveguiding bulk crystals previously obtained are a direct consequence of supersaturation of the pentaphosphate compound in the solution.

As a specific example, a batch of acicula was obtained in a typical growth run with 1.0 gram rare earth oxides per 100 milli-liters of an 85 percent $H_3PO_4$ solution equilibrated at 300° C for 3 days during which period a reasonable concentration of $H_4P_2O_7$, in which rare earth pentaphosphates have maximum solubility, is formed, and then condensed to more dense poly acids which do not dissolve significant amounts of the pentaphosphates for 4 days at 550° C, the so-called interaction temperature, under a nitrogen stream containing water vapor obtained by bubbling the nitrogen through the 25° C water bath. The interaction or growth temperature of 550° C was chosen because previous experience in the growth of bulk crystals showed that the most optically perfect crystals were grown at this temperature. An interaction temperature of 550° C is also the minimum growth temperature at which hydrogen containing impurities which cause fluorescence-quenching are eliminated from the grown crystals. The acicula comprised 5–10 percent of the total crystals in the solution at the conclusion of the run. The acicula were from 10 micrometers thick to about 100 micrometers thick and were about 0.5 millimeter long to about 2 millimeters long. The aspect ratios, the ratio of length to diameter of the acicula, range from about 25:1 to about 200:1. For device use, we tend to prefer those acicula of smallest diameter and largest aspect ratio.

Figure 5:
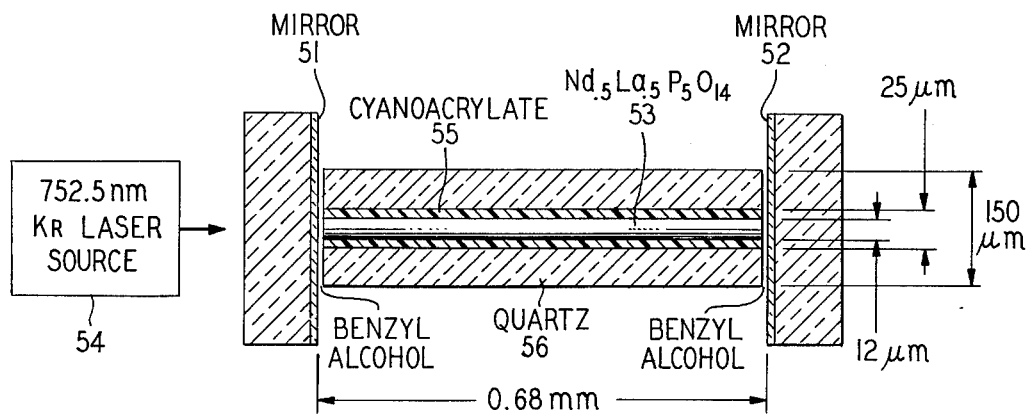
FIG. 5 is a partially pictorial and partially block diagrammatic illustration of an optically pumped laser employing a single aciculum.

Acicula of the type just described and composed essentially of $La_{0.5}Nd_{0.5}P_5O_{14}$ have been used to construct a successfully operated continuous-wave waveguide laser, as shown in FIG. 5, described hereinafter.

Figure 2:
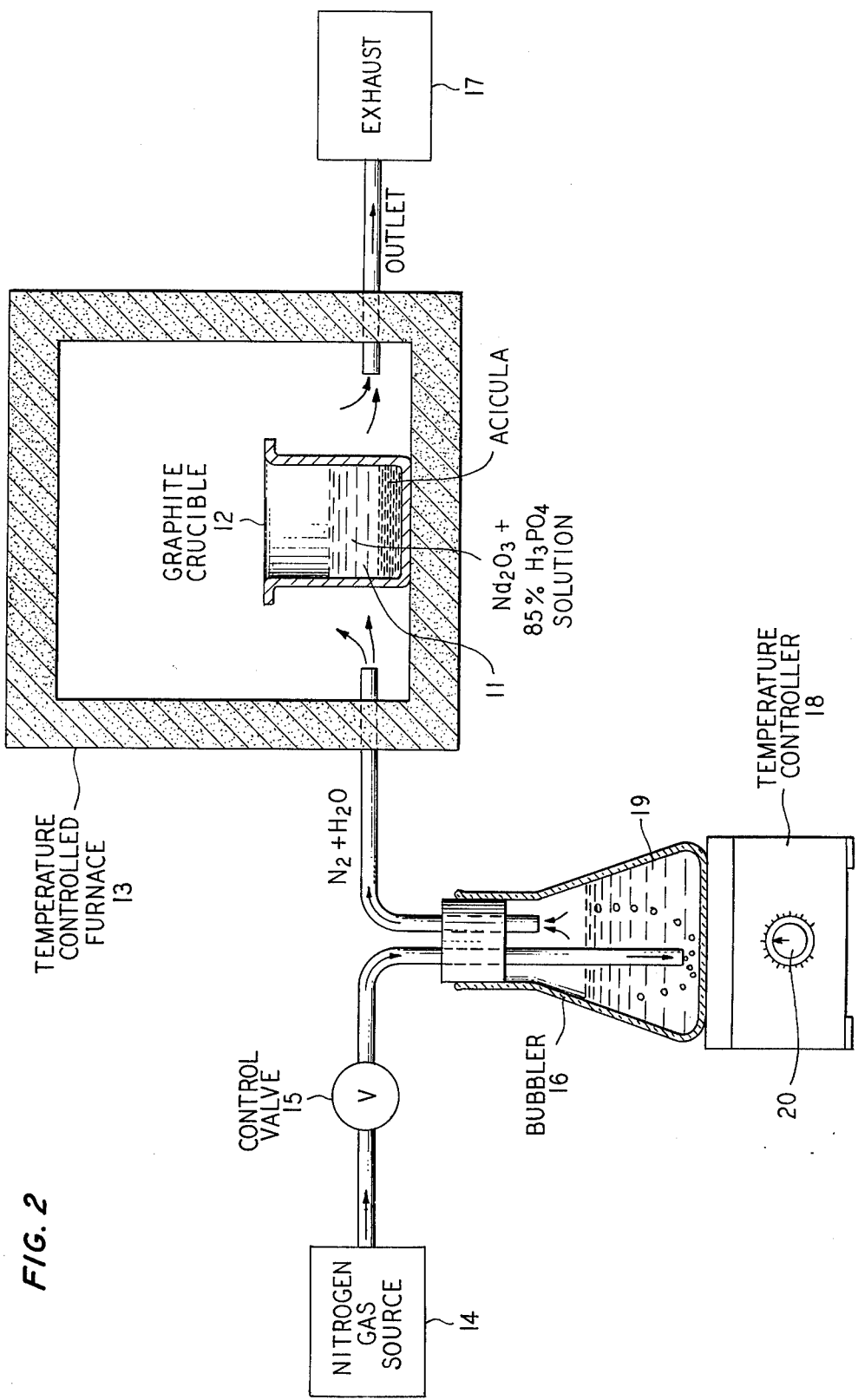
FIG. 2 is a partially pictorial and partially block diagrammatic illustration of the apparatus in which the method of the invention is illustratively practiced.

The apparatus used in the process described above is shown in FIG. 2. In this case the mixture 11 of rare earth oxides and an 85 percent $H_3PO_4$ solution is placed in a graphite crucible 12. The crucible 12 is placed within the temperature controlled furnace 13 of conventional type. Through the furnace 13 is flowed a stream of a relatively inert gas, illustratively nitrogen, from a source 14 through a control valve 15, through a bubbler 16 into the furnace and then out of the furnace through the exhaust apparatus 17 which may comprise some sort of pump or fan.

It appears to be critical to the present invention that the temperature of the water bath 19 in bubbler 16 be controlled to be within a certain temperature range, as it is discovered that acicula will not grow in crucible 12 when the bath is held near freezing (0° C), nor when the gas atmosphere flowed through furnace 13 is purely water vapor. To this end, a temperature controller 18 which provides heat at a controlled temperature is placed in heat transfer coupling with bubbler 16. Here, illustratively, bubbler 16 is a flash which sits upon a heating element of temperature controller 18 and the temperature at the interface of bubbler 16 and temperature controller 18 is controlled to the desired temperature setting, set by a dial 20.

We have found that the temperature of the water bath 19 in bubbler 16 should be in the range between about 15° and about 80° C in order for an appreciable proportion of the crystals grown in crucible 12 to be the desired acicula. It may be observed that, in many runs at temperatures differing from 25° C of bath 19, a very large proportion of the crystals grown in crucible 12 are, in fact, bulk-type crystals of the prior art type or large bulk-type crystals which have nucleated and grown about the midsection of an aciculum. Nevertheless, a significant proportion of acicula will be obtained in the above described temperature range of the bath 19 in bubbler 16.

The above described temperature range of bath 19 in bubbler 16 corresponds to the range between 14 grams per cubic meter and 290 grams per cubic meter of water vapor in the atmosphere above the solution in crucible 12.

Figure 3:
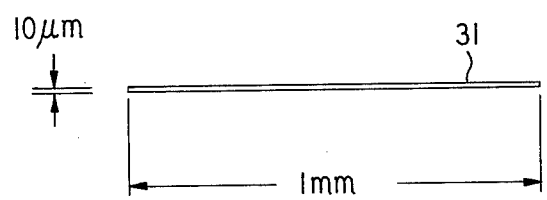
FIG. 3 shows a pictorial representation of a typical aciculum made according to the invention.

In FIG. 3 is shown a typical aciculum about 1 millimeter long and of about 10 micrometers diameter. It will be noted that this diameter is substantially smaller than the single crystal fiber diameters obtained by growth from a melt in the case of an yttrium aluminum garnet crystal, as disclosed in the copending patent application of C. A. Burrus et al., Ser. No. 591,178 filed June 27, 1975, and assigned to the assignee hereof.

Figure 4:
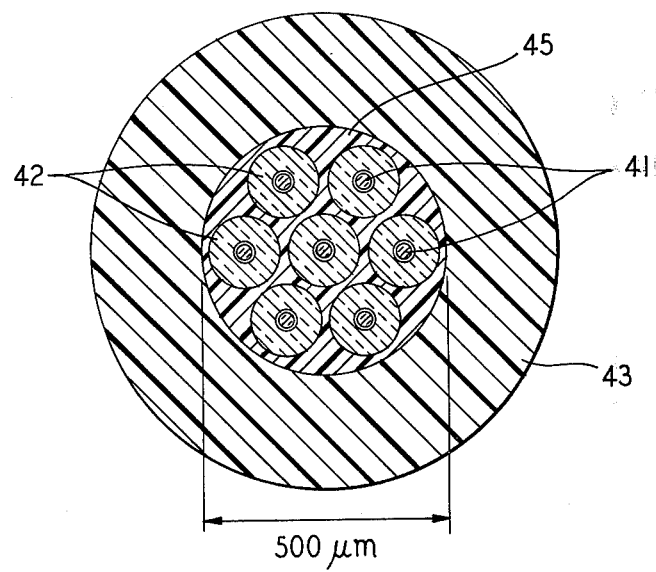
FIG. 4 shows a plurality of acicula mounted in fine capillaries which are, in turn, mounted in a larger capillary for the purpose of polishing the ends of the acicula.

In FIG. 4 there is shown a feasible means we have found for polishing the ends of the acicula to be planar and at 90° angles to the acicula axis. The polished surfaces are thus parallel and reflectors may be coated onto them. Each aciculum 41 is mounted in a very fine capillary tube 42 illustratively of typically about 25 micrometers internal diameter and is cemented therein with alpha cyanoacrylate. The outer diameter of the capillaries is typically about 150 micrometers. Obviously an aciculum of larger diameter should be mounted in a capillary with larger internal diameter. This result may be accomplished in the following way. First, each of the small capillary tubes, which empty, is mounted into a larger diameter glass tube 43 or capillary of about 500 micrometers internal diameter and 5 millimeters outside diameter. It will be noted that the latter diameters illustratively have about a 10:1 ratio of outside diameter to inside diameter. The small capillaries, illustratively empty, were allowed to extend about 10 millimeters beyond either end of the glass tube 43, which was illustratively 20 millimeters long. The small capillaries 42 are cemented into the glass tube 43 with alpha cyanoacrylate cement 45. It is characteristic of alpha cyanoacrylate that it hardens quickly as soon as it is brought into small cavities.

After curing, slices of two millimeters thickness with surfaces orthogonal to the rod axis were cut; and the end surfaces were polished.

The 25 micrometer holes, still empty, in the small capillaries were cleaned in an ultrasonic bath and then further cleaned with a jet stream of hexane. The acicula 41 were then inserted into the cleaned holes under a microscope with micromanipulators. The acicula were used as grown and only cleaned by rinsing in water.

The surfaces of the cut 2 millimeter thick disk or slice were further polished until the crystalline acicula ends appeared exposed at the disc surfaces. This rather complicated procedure assured that throughout the machining and polishing process the acicula axes remained normal to the polished surfaces.

Alternatively, the small acicula in some of the runs were inserted first into the smaller capillaries which were thereafter inserted into the larger capillary. Also, instead of coating mirrors on the end of the assembly of capillaries and acicula, the properly prepared and polished disk may be placed between two plain parallel mirrors as shown in the embodiment of FIG. 5.

More specifically in FIG. 5, the mirrors 51 and 52 had reflectivities of 99.8 percent at 1.05 micrometers. The showing of FIG. 5 is merely tutorial as we have found it advantageous to immerse the mirrors in benzyl alcohol to reduce the loss at the interface between the pentaphosphate crystal 53 and the mirrors 51 and 52. The aciculum 53 stands vertically on mirror 52 with the thin film of benzyl alcohol therebetween; and the top of mirror 51 merely floats on the surface of the liquid film.

The neodymium pentaphosphate laser of FIG. 5 is longitudinally pumped at room temperature with the 752.5 nanometer wavelength beam of the krypton ion laser source 54. Source 54 typically includes a lens to focus the beam through mirror 51 into the aciculum 53. In our experiment, the lens was a 10 millimeter focal length lens. For simplicity, only one of the acicula that were prepared in a configuration like that of FIG. 4 is shown in FIG. 5; but in fact the arrangement of FIG. 4 may replace the illustrated components 53, 55 and 56 of FIG. 5. The refractive indices of the pentaphosphate core and the cyanoacrylate polymer cladding are 1.62 and 1.48, respectively, and hence the approximately 12 micrometers diameter core can support up to the 15th order transverse mode. Loss is lowest for the fundamental mode. For this laser, which represents our first successful approach to the construction of a single-crystal fiber laser, we have measured a threshold of less than 10 milliwatts of absorbed power for continuous-wave operation. This value does not far exceed the best reported for a bulk laser of a pentaphosphate, and further optimization is possible. In the first version the loss was calculated to be about 50 percent per pass. A large amount of this loss probably results predominantly from scatter due to an imperfect interface between the fiber and the alpha cyanoacrylate cement. It is not unreasonable to anticipate a reduction of this loss to 1 percent per pass which would result in a threshold of 160 microwatts of pump power for the present geometry.

The confocal parameter for the crystal diameter of 12 micrometers is 0.23 millimeters, which is only one-third the distance between mirrors. (Fresnel number 0.05.) This short confocal parameter would result in a diffraction loss of about 90 percent per pass in the absence of waveguiding and would far exceed the calculated gain at threshold. Thus the waveguiding effect of the crystalline fiber is an essential feature of operation of this laser.

Figure 6:
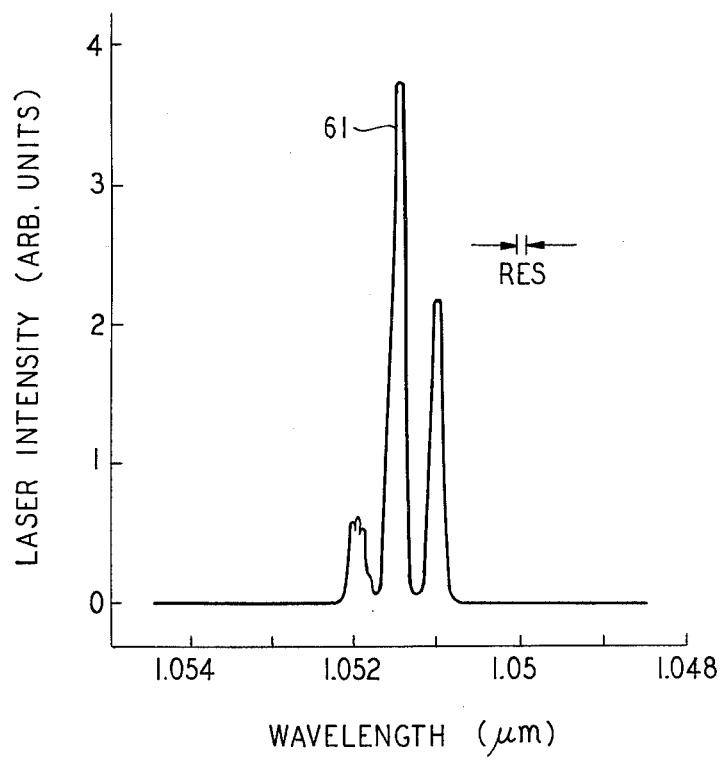
FIG. 6 shows a curve representing the laser spectrum of the embodiment of FIG. 5.

From the mirror separation $d = 0.68$ millimeter, one evaluates a longitudinal mode spacing of $\Delta\lambda = 5.0$A. FIG. 6 shows the output spectrum, which confirms this value. Most likely the laser oscillates in the lower order transverse modes, because they have lower loss. In the curve of FIG. 6, the wavelength is shown along the abscissa, the horizontal axis; and the laser intensity in relative units is shown along the ordinate, or vertical axis.

What is claimed is:

1. A process for producing acicular of rare earth pentaphosphates with ratios of length to diameter of greater than about 25 to 1 comprising the steps of mixing oxides of selected rare earths with a solution of $H_3PO_4$, heating said solution to cause conversion of the $H_3PO_4$ to metaphosphoric acids and then heating to a temperature of approximately 550° C to develop more highly condensed poly acid forms, and controlling the acid conversion during said heating by flowing a stream of gas over said mixture, said gas stream containing an inert gas and water vapor in the range between approximately 14 grams per cubic meter and approximately 290 grams per cubic meter, whereby acicula of rare earth pentaphosphates are obtained in said mixture, and removing said acicula from said mixture.

2. A process according to claim 1 in which the flowing step comprises flowing the inert gas through a bubbler containing water, the acid conversion controlling step including means for controlling the temperature of the water in the bubbler to be between 15° and 80° C.

* * * * *